United States Patent
Aubreville et al.

(10) Patent No.: US 9,398,379 B2
(45) Date of Patent: Jul. 19, 2016

(54) METHOD OF CONTROLLING A DIRECTIONAL CHARACTERISTIC, AND HEARING SYSTEM

(71) Applicant: SIVANTOS PTE. LTD., Singapore (SG)

(72) Inventors: Marc Aubreville, Nuremberg (DE); Eghart Fischer, Schwabach (DE); Stefan Wehr, Hirschaid-Seigendrof (DE)

(73) Assignee: Sivantos Pte. Ltd., Singapore (SG)

( * ) Notice: Subject to any disclaimer, the term of this patent is extended or adjusted under 35 U.S.C. 154(b) by 85 days.

(21) Appl. No.: 13/870,127

(22) Filed: Apr. 25, 2013

(65) Prior Publication Data

US 2013/0287237 A1    Oct. 31, 2013

Related U.S. Application Data

(60) Provisional application No. 61/637,996, filed on Apr. 25, 2012.

(51) Int. Cl.
*H03G 3/20* (2006.01)
*H04R 25/00* (2006.01)
*H04R 3/00* (2006.01)
*H03G 3/32* (2006.01)

(52) U.S. Cl.
CPC .............. *H04R 25/40* (2013.01); *H04R 25/407* (2013.01); *H03G 3/32* (2013.01); *H04R 3/005* (2013.01); *H04R 25/552* (2013.01)

(58) Field of Classification Search
USPC ........................ 381/57, 92, 98, 111
See application file for complete search history.

(56) References Cited

U.S. PATENT DOCUMENTS

| | | | | |
|---|---|---|---|---|
| 5,625,697 A | * | 4/1997 | Bowen et al. | 381/92 |
| 7,822,217 B2 | | 10/2010 | Hagen et al. | |
| 2003/0072465 A1 | * | 4/2003 | Fischer et al. | 381/317 |
| 2004/0252852 A1 | | 12/2004 | Taenzer | |
| 2007/0160254 A1 | | 7/2007 | Ritter et al. | |
| 2008/0086309 A1 | | 4/2008 | Fischer et al. | |
| 2010/0158290 A1 | | 6/2010 | Puder | |
| 2012/0020485 A1 | * | 1/2012 | Visser | H04R 3/005 381/57 |

FOREIGN PATENT DOCUMENTS

DE   10114101 A1   6/2002
EP   2 107 826 A1  10/2009

* cited by examiner

*Primary Examiner* — Davetta W Goins
*Assistant Examiner* — Amir Etesam
(74) *Attorney, Agent, or Firm* — Lawrence A. Greenberg; Werner H. Stemer; Ralph E. Locher

(57) ABSTRACT

A directional characteristic of a microphone facility of a hearing system is more reliably controlled. The method determines a first feature value in respect of speech in a first signal of a microphone facility assigned to a first direction and a second feature value in respect of speech in a second signal of the microphone facility assigned to a second direction. A control value is obtained from the difference of the two feature values. The directional characteristic of the microphone facility is controlled with this control value.

10 Claims, 3 Drawing Sheets

METHOD OF CONTROLLING A DIRECTIONAL CHARACTERISTIC, AND HEARING SYSTEM

CROSS-REFERENCE TO RELATED APPLICATION

This application claims the benefit, under 35 U.S.C. §119 (e), of provisional patent application No. 61/637,996, filed Apr. 25, 2012, which is herewith incorporated by reference in its entirety.

BACKGROUND OF THE INVENTION

Field of the Invention

The present invention relates to a method for controlling a directional characteristic of a microphone facility of a (possibly binaural) hearing system having a first hearing apparatus and a second hearing apparatus. Furthermore, the present invention relates to a corresponding (binaural) hearing system. The term hearing apparatus is understood here to mean any auditory stimulus-producing device which can be worn in or on the ear, in particular a hearing device, a headset, earphones or the like.

Hearing devices, such as hearing aids, are wearable hearing apparatuses which are used to provide hearing assistance to the hard-of-hearing. In order to accommodate the numerous individual requirements, various designs of hearing devices are available such as behind-the-ear (BTE) hearing devices, hearing device with external earpiece (RIC: receiver in the canal) and in-the-ear (ITE) hearing devices, for example also concha hearing devices or completely-in-the-canal (ITE, CIC) hearing devices. The hearing devices listed as examples are worn on the outer ear or in the auditory canal. Bone conduction hearing aids, implantable or vibrotactile hearing aids are also available on the market. With these devices the damaged hearing is stimulated either mechanically or electrically.

The key components of hearing devices are principally an input transducer, an amplifier and an output transducer. The input transducer is normally a sound transducer e.g. a microphone and/or an electromagnetic receiver, e.g. an induction coil. The output transducer is most frequently realized as an electroacoustic transducer, e.g. a miniature loudspeaker, or as an electromechanical transducer, e.g. a bone conduction receiver. The amplifier is usually integrated into a signal processing unit. This basic configuration is illustrated in FIG. 1 using the example of a behind-the-ear (BTE) hearing device. One or more microphones 2 for picking up ambient sound are incorporated into a hearing device housing 1 to be worn behind the ear. A signal processing unit (SPU) 3 which is also integrated into the hearing device housing 1 processes and amplifies the microphone signals. The output signal from the signal processing unit 3 is transmitted to a loudspeaker or receiver 4, which outputs an acoustic signal. The sound may be transmitted to the device wearer's eardrum by way of an acoustic tube which is fixed in the auditory canal by means of an earmold. Power for the hearing device and in particular for the signal processing unit 3 is supplied by means of a battery (BAT) 5 which is also integrated in the hearing device housing 1.

Many hearing devices are nowadays able to automatically control the directional microphone between a directional mode, an anti-directional mode and an omnidirectional mode. Accordingly, the sound is first amplified from the front or from the rear or it is processed identically from all directions without directionality. The automatic control is generally based on determining speech features which are extracted from the microphone signals. In a critical situation, if a number of people are in a room for instance, this automatic control function may result in unacceptable decisions. This may result in frequent switching processes particularly if two speakers speak from different directions in respect of the hearing device wearer. A continuously fluctuating sound impression which confuses the hearing device wearer results therefrom.

If for this purpose a directional microphone is used in a concrete example to amplify sound from one side of the hearing device wearer, the switching between the directions "left" and "right" may result in very unpleasant fluctuations in the sound impression. In particular, the hearing device would continuously switch to the louder speaker in the case of a person speaking on the left-hand side and a person speaking on the right-hand side of the hearing device wearer. If both speakers exhibit a comparable level, a toggling would occur therebetween, thereby resulting in significant differences in the respective sound level in the respect of a speaker.

This problem was previously counteracted by moving very slowly to and fro between two microphone directions. Rapid changes in respect of the direction decision are herewith not so easily perceptible to the wearer.

SUMMARY OF THE INVENTION

It is accordingly an object of the invention to provide a method of controlling the directional characteristic, and a corresponding hearing system, which overcome the above-mentioned disadvantages of the heretofore-known devices and methods of this general type and which provides for the ability to control a hearing system having at least one hearing apparatus in a more stable manner with respect to the directional characteristic. Furthermore, a corresponding hearing system, which may be binaural or optionally binaural, is to be provided.

With the foregoing and other objects in view there is provided, in accordance with the invention, a method of controlling a directional characteristic of a microphone facility of a hearing system having at least one hearing apparatus, the method which comprises:

determining a first feature value in respect of speech in a first signal of the microphone facility assigned to a first direction, determining a second feature value in respect of speech in a second signal of the microphone facility assigned to a second direction, obtaining a control value from the two feature values and controlling the directional characteristic of the microphone facility with the aid of the control value.

Furthermore, provision is made in accordance with the invention for a (binaural) hearing system having at least one hearing apparatus, wherein the hearing apparatus comprises a microphone facility with a directional characteristic, wherein the microphone facility is embodied to determine a first feature value in respect of speech in a first signal of the microphone facility assigned to a first direction and to determine a second feature value in respect of speech in a second signal of the microphone facility assigned to a second direction, a control facility embodied in the at least one hearing apparatus in order to obtain a control value from the two feature values and to control the directional characteristic of the microphone facility with the aid of the control value.

The signals from two different directions are therefore advantageously analyzed in respect of speech features, i.e. one or a number of properties characteristic of speech. This analysis results in feature values, the difference or other relationship of which can be used to control the directional characteristic of the hearing system. The difference between values, which are characteristic of speech, is therefore used as a reliable decision criterion for embodying the directional characteristic of a hearing system.

The first direction is preferably opposed to the second direction. Signals from opposite directions are therefore analyzed in respect of the speech-characteristic properties. This is advantageous in that two half spaces can be analyzed separately from one another, and the directional characteristic can be embodied accordingly. It is in particular favorable if the hearing apparatus is worn conventionally in or on the two ears of a user, and the first direction points to the left or to the front in respect of the user. Accordingly, the second direction then points to the right or to the rear in respect of the user.

The feature values may each display a probability with which speech exists in the respective signal of the microphone facility. Furthermore, they may also easily represent an amplitude or a level of a signal qualified as speech.

In order to obtain the control value, the difference between the two feature values can be related to the minimum of the two feature values. The reference should in particular be established by dividing the difference by the minimum of the two feature values. This produces a pure numerical value, in which signal-to-noise ratios are also taken into account.

According to one embodiment, the control value can be obtained from the difference related to the minimum by means of a freely selectable assignment set. The decision-making can thus be configured even more clearly. A hysteresis can also be integrated for instance.

It is also advantageous if the directional characteristic is formed by overlaying a directional signal and an omnidirectional signal of the microphone facility and in the process the directional signal and the omnidirectional signal are weighted with the aid of the control value. It is herewith possible for the microphone facility to be cross-faded from a directional operation into an omnidirectional operation or vice versa.

The method can in particular be realized such that the directionality of the directional characteristic increases with an increasing control value based on the omnidirectionality. The system can however also be embodied such that it is cross-faded from one direction to another direction depending on the increasing control value.

It is particularly advantageous if a data link between the at least one and a further hearing apparatus of the hearing system is be activated and/or deactivated as a function of the directional characteristic. It is herewith possible that if the automatic control of the directional characteristic predefines an omnidirectionality of the microphone facility, a data exchange between the two hearing apparatuses is prevented, thereby resulting in significant energy savings.

Other features which are considered as characteristic for the invention are set forth in the appended claims.

Although the invention is illustrated and described herein as embodied in a method for controlling a directional characteristic and hearing system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
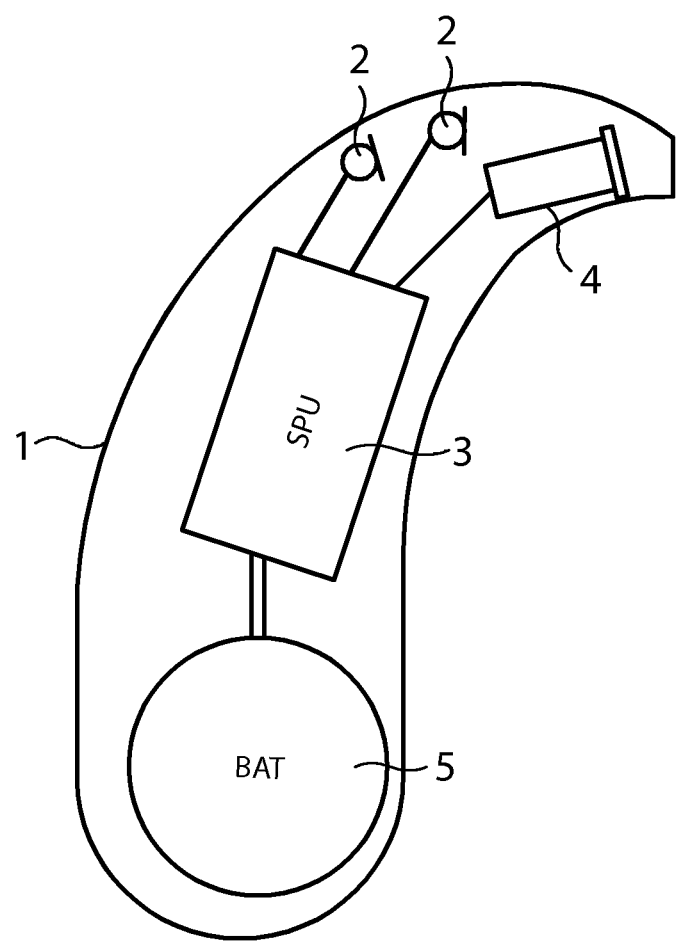
FIG. 1 shows the basic structure of a hearing device according to the prior art.

The exemplary embodiments illustrated in more detail below represent preferred embodiments of the present invention.

According to an embodiment, provision is made for a hearing device system having two hearing devices (first hearing apparatus and second hearing apparatus). A data link exists between both hearing devices, so that the output signals of both hearing devices can be processed jointly. In particular, a microphone facility, also referred to as a microphone system or a microphone assembly, can be realized by way of the hearing devices which are connected to one another in a data-specific manner, the directional characteristic of which can be varied almost arbitrarily in the entire room provided the two hearing devices are worn conventionally in or on the ears of the hearing device wearer. The directional characteristic may be aligned more or less sharply on a source. A directional "beamformer" is mentioned, the intensity and/or beam width of which can be varied. During omnidirectional operation, sound is recorded evenly from all directions, while during directional operation, the receiving beam is aligned in a specific direction. In this preferred direction, the microphone facility (here the directional microphone) has greater sensitivity, whereas in other directions, it is more or less significantly attenuated.

In order now to adjust the direction and/or width of the receiver lobe, two different output signals of the directional microphone are examined in respect of speech portions and/or speech features. These output signals of the directional microphone originate from different operating modes of the directional microphone. They thus originate for instance from the two concrete modes, such that the receiver lobe is aligned on the one hand to the left and on the other hand to the right. Alternatively, the operating modes can also be defined such that the receiver lobes are aligned to the front or to the rear in respect of the hearing device wearer. In one instance speech features are therefore examined in the signals from the left and right and in the other instance in the signals from the front and from the rear.

A value f is subsequently calculated, which specifies how large the difference of the speech features is between both signals. Speech features are for instance the 4 Hz modulation, the so-called speech onset (level increase at the start of speech) or a signal-to-noise ratio related to speech. The absolute value of the difference is then standardized with the minimum of the feature values of both speech features. For the value f, the following formula results:

$$f=\text{abs}(m1-m2)/\min(m1,m2),$$

where: abs represents the absolute value function;
min is the minimum function; and
m1, m2 are the feature values of the speech features.

The value f is large for large differences between two feature values m1 and m2. If m1=0.1 and m2=0.8 for instance, the following results f=0.7/0.1=7. This is the case if noise from another side comes as the desired signal for instance and if the signal-to-noise ratio is minimal.

If the signal-to-noise ratio is by contrast good, the difference between the two feature values m1 and m2 will be small. The minimum of both values will by contrast be relatively high. This results in a low value f. For instance, the feature values are m1=0.8 and m2=0.7. f=0.1/0.7=0.14 results therefrom.

If by contrast the signal-to-noise ratio is poor, the minimum of both feature values will increase the value f. This is the case for instance if m1=0.1 and m2=0.2. The value f=0.1/0.1=1 then results.

If the signal-to-noise ratio is too poor, the directional microphone will not offer any benefits. Furthermore, it is also advantageous to switch into omnidirectional operation if the signal-to-noise ratio is minimal and strong speech signals are registered for instance from both sides. The omnidirectional operation then results in an improved speech perception. In both instances, the value f is small and a control signal for the omnidirectional operation should be generated therefrom.

If on the other hand, as illustrated above, a speaker is only present on one side, the value f is high and the directional operation should be used.

Figure 3:
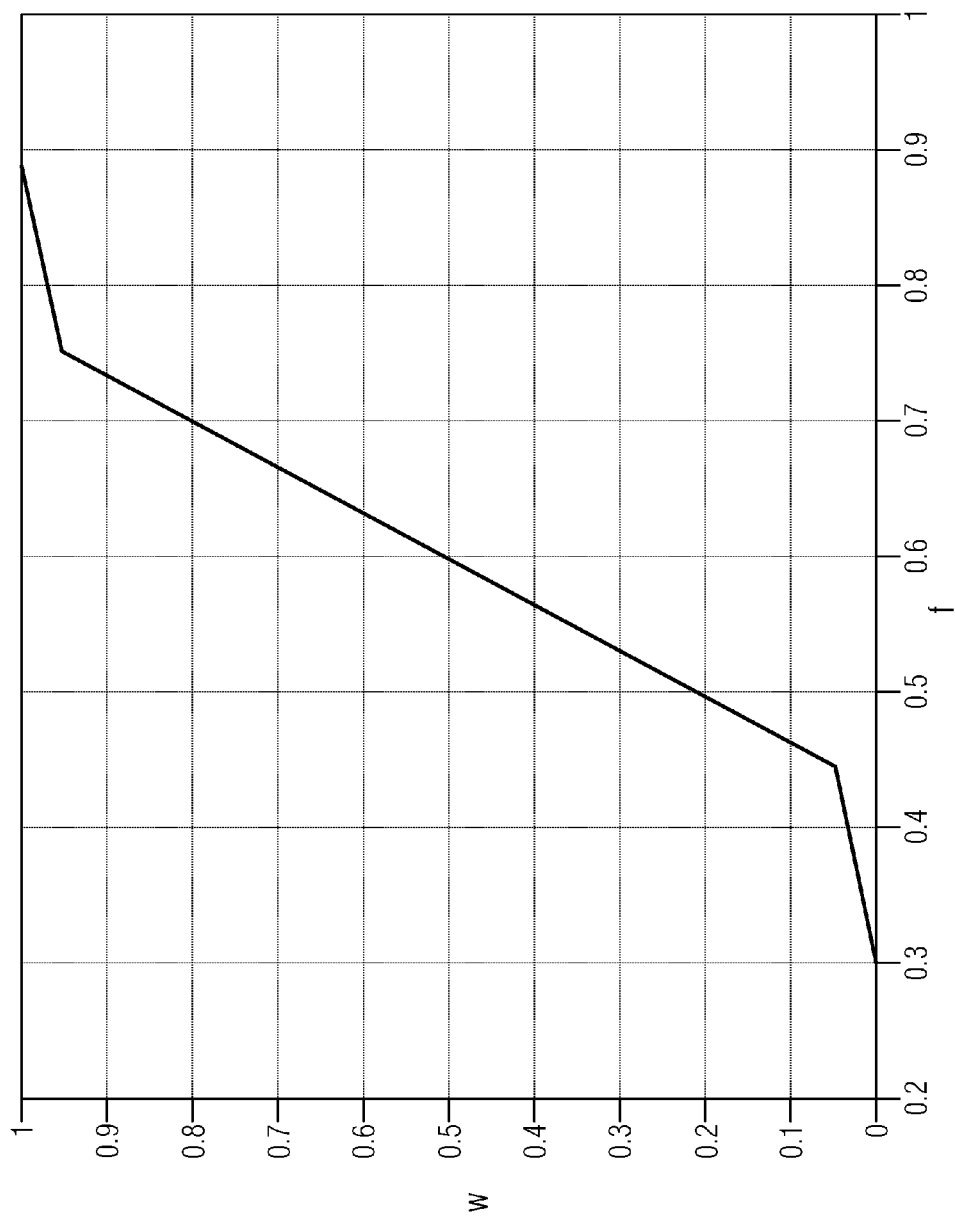
FIG. 3 shows an exemplary look-up table for obtaining a control signal.

With an assignment set, the value f can be converted into a control value w. The assignment set may be an analytical function, which maps the value f to the control value w. Furthermore, the assignment set may also be a value table and/or a look up table, with which the control value w is determined from a value f. A lookup table of this type is indicated in FIG. 3.

The microphone facility and/or its directional characteristic can now be controlled with the control signal w. In this way it is possible for instance to switch into omnidirectional operation or directional operation. Although the preceding and also subsequent examples always relate toggling between directional operation and omnidirectional operation, a specific direction of the directional characteristic can also be set for instance with the aid of a control value. It may be advantageous in terms of frontally aligning the beam former forwards in the case of low values f and/or w, so that with poor ratios, the frontal direction is always amplified.

To that effect, control of the directional characteristic can also be optimized such that toggling does not occur between two states, but that a gradual transition occurs between both states in accordance with a predetermined function. If a directional signal and an omnidirectional signal are generated for instance by the microphone facility, both signals can be mixed with one another for an output signal S_out the omnidirectional signal S_omni and the directional signal S_dir. The mixing takes place for instance as a function of the control value w according to the following formula:

$$S\_out = w \cdot w\_dir + (1-w) \cdot S\_omni.$$

This algorithm ensures that the directional microphone is only used in distinct situations if for instance only one speaker is present in the current hearing situation. This facilitates the rapid switching in distinct situations compared with the known concepts of slow cross-fading, in order to mask switching fluctuations. In situations with a number of speakers, the hearing device remains in an omnidirectional mode and does not toggle continuously. This reduces corresponding irritations for the hearing device wearer.

When using a beam former with a binaural data link between the two hearing devices, the invention allows for the audio transmission between the two hearing devices not to be activated and/or deactivated if it is not necessary and/or advantageous in the respective situation. Considerable energy can be saved in this way. For instance, it is possible to dispense with a binaural audio data transfer, if omnidirectional operation is desired and/or adjusted in both hearing devices.

The above exemplary embodiments relate to binaural hearing systems. In principle, control of the directional characteristic of a microphone facility can however also take place in a monaural hearing system in the manner illustrated.

Figure 2:
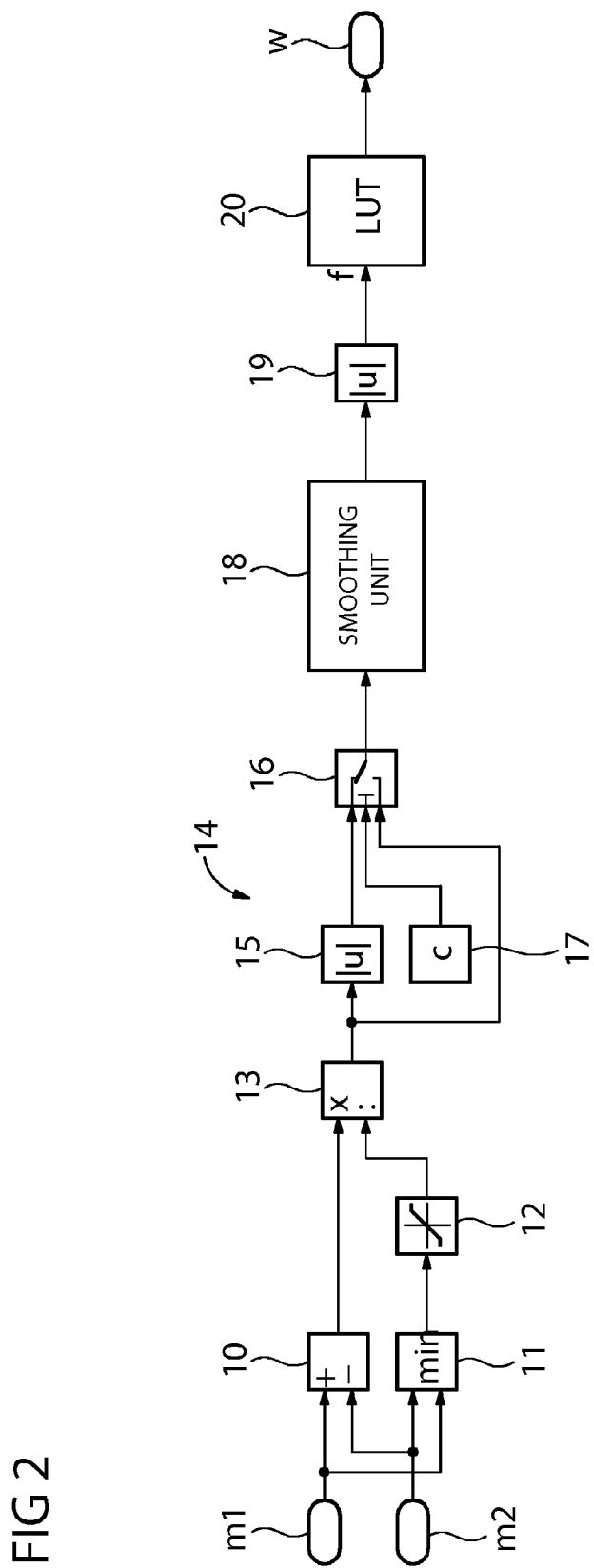
FIG. 2 shows a block diagram of an exemplary embodiment of the invention.

Referring now to the figures of the drawing in detail and, particularly, to FIGS. 1 and 2 thereof, there is illustrated a concrete exemplary implementation as to how the control value w can be determined. The speech features m1 and m2 are firstly entered into the algorithm realized according to FIG. 2. Both feature values m1 and m2 are supplied to a subtraction unit 10 and a minimum unit 11. A limiter unit 12 is arranged downstream of the minimum unit 11 in order to prevent a subsequent division by 0. A division facility 13 divides the difference signal of the difference unit 10 by the minimum of the two feature values m1 and m2, which was limited if necessary by the limiter unit 12. In a unit 14 connected downstream, it is possible to select whether or not the sum is formed of the quotient of the division unit 13. To this end, the quotient is on the one hand supplied to a toggle switch 16 via a contribution unit 15 and on the other hand directly to the toggle switch 16. The toggle switch 16 is activated accordingly by way of a control unit 17. A smoothing unit 18 is arranged downstream of the toggle switch 16. The smoothing unit 18 effects a smoothing of the value f in order to prevent a too-frequent panning or switch-over between different operating modes of the microphone facility. A contribution formation is then carried out in an absolute value unit 19. It is therefore possible if necessary to dispense with the unit 14 arranged upstream. The function for calculating the value f is so far now realized.

The control value w is finally generated with the aid of a lookup table 20. The lookup table 20 herewith represents an assignment set. One example of this is reproduced in FIG. 3. The concrete example is a function, accordingly the values f up to approximately 0.45 are transformed to a very small control value w below 0.1. For values below a predetermined threshold value, it is possible to dispense with an audio data link. The microphone facility is to be used here essentially during omnidirectional operation. Only from values of f>0.75 will the situation be reliably favorably graded as for directional operation and a high control value close to 1 assigned to these values f. A transition range which proceeds relatively steeply is produced for values f between 0.45 and 0.75.

With the resulting control values w, two signals can now be weighted according to the above-specified formula. In particular, a directional signal S-dir and an omnidirectional signal S_omni or another signal from a defined direction can thus be mixed with one another.

The invention claimed is:

1. A method of controlling a directional characteristic of a microphone facility of a hearing system having at least one hearing apparatus, the method which comprises:
   determining a first feature value in respect of speech in a first signal of the microphone facility assigned to a first direction;
   determining a second feature value in respect of speech in a second signal of the microphone facility assigned to a second direction;
   obtaining a control value from the first and second feature values, wherein the step of obtaining the control value includes calculating a difference between the first and second feature values, calculating the minimum of the first and second feature values, and standardizing said calculated difference between the first and second feature values with said calculated minimum of the first and second feature values; and controlling the directional characteristic of the microphone facility with the aid of the control value.

2. The method according to claim 1, wherein the first direction is opposite the second direction.

3. The method according to claim 2, wherein the at least one hearing apparatus is configured to be worn conventionally in or on an ear of a user, and the first direction points laterally sideways or forward in respect of the user.

4. The method according to claim 3, wherein the first direction points to the left or forward in respect of the user.

5. The method according to claim 1, wherein each of the first and second feature values represents a probability that speech is present in a respective signal of the microphone facility.

6. The method according to claim 1, wherein step of obtaining the control value comprises selecting from a freely selectable assignment set from the difference related to the minimum.

7. The method according to claim 1, which comprises forming the directional characteristic by overlaying a directional signal and an omnidirectional signal of the microphone facility, to thereby weight the directional signal and the omnidirectional signal with the aid of the control value.

8. The method according to claim 7, wherein a value of the directionality of the directional characteristic increases with an increasing control value based on the omnidirectionality.

9. The method according to claim 1, wherein the hearing system includes the at least one hearing apparatus and a further hearing apparatus and a data link between the at least one hearing apparatus and the further hearing apparatus, and the method comprises selectively activating and/or deactivating the hearing system in dependence on the control value.

10. A hearing system, comprising:

at least one hearing apparatus having a microphone facility with a directional characteristic;

said microphone facility being configured to determine a first feature value in respect of speech in a first signal of the microphone facility assigned to a first direction and to determine a second feature value in respect of speech in a second signal of the microphone facility assigned to a second direction; and a control device in said at least one hearing apparatus configured to receive signals representing the first and second feature values, to obtain from the first and second feature values a control value, and to control the directional characteristic of said microphone facility with the aid of the control value;

said control device configured to obtain the control value by calculating a difference between the first and second feature values, calculating the minimum of the first and second feature values, and standardizing said calculated difference between the first and second feature values with said calculated minimum of the first and second feature values.

* * * * *